(12) United States Patent
Kanegae et al.

(10) Patent No.: US 7,279,739 B2
(45) Date of Patent: Oct. 9, 2007

(54) NON-VOLATILE SEMICONDUCTOR MEMORY DEVICE HAVING NANO-DOTS ON A TUNNEL INSULATING FILM

(75) Inventors: Yoshiharu Kanegae, Hitachinaka (JP); Tomio Iwasaki, Tsukuba (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/354,092

(22) Filed: Feb. 15, 2006

(65) Prior Publication Data
US 2006/0180852 A1 Aug. 17, 2006

(30) Foreign Application Priority Data
Feb. 16, 2005 (JP) .............................. 2005-038537

(51) Int. Cl.
*H01L 29/788* (2006.01)
(52) U.S. Cl. ..................... 257/321; 257/315; 257/316; 977/774; 438/264
(58) Field of Classification Search ............... 257/321, 257/315, 316; 438/264
See application file for complete search history.

(56) References Cited
U.S. PATENT DOCUMENTS
2004/0245579 A1* 12/2004 Ohmi et al. ............... 257/376

2007/0014151 A1* 1/2007 Zhang et al. .......... 365/185.01

OTHER PUBLICATIONS

S. Tiwari et al. IEEE International Electron Devices Meeting pp. 521-524 (1995).
R.W.G. Wyckoff, Crystal Structure Second Edition, vol. 1, John Wiley & Sons, Inc. (1963).

* cited by examiner

*Primary Examiner*—Jerome Jackson
*Assistant Examiner*—Michael Durbin
(74) *Attorney, Agent, or Firm*—Antonelli, Terry, Stout & Kraus, LLP.

(57) ABSTRACT

There is provided a high-reliability nano-dots memory by forming the nano dots uniformly. Also, there is provided the high-speed and high-reliability nano-dots memory by employing a silicon-oxide-film alternative material as a tunnel insulating film. The nano-dots memory includes the tunnel insulating film and silicide nano-dots of $CoSi_2$ or $NiSi_2$. Here, the tunnel insulating film is formed by epitaxially growing a high-permittivity insulating film of $HfO_2$, $ZrO_2$ or $CeO_2$ on a silicon or germanium substrate, or preferably, on a silicon or germanium (111) substrate. Also, the silicide nano-dots are formed on the tunnel insulating film.

12 Claims, 13 Drawing Sheets

NON-VOLATILE SEMICONDUCTOR MEMORY DEVICE HAVING NANO-DOTS ON A TUNNEL INSULATING FILM

BACKGROUND OF THE INVENTION

The present invention relates to non-volatile semiconductor memories.

Such semiconductor memories as flash memory and EEPROM are non-volatile and electrically rewritable. Accordingly, these semiconductor memories are widely used as program-used or data-used memories in apparatuses such as digital household electrical-appliances and vehicle-installed controllers. In the conventional products of these non-volatile semiconductor memories, the high-speed implementation and large-capacity implementation require miniaturization of the elements. It has been known, however, that, in order to maintain the data retention characteristics, a limit exists in the thinning of a silicon oxide film used as the tunnel insulating film in particular. Also, a degradation occurs in the tunnel insulating film, because hot carriers are injected into a floating gate via the tunnel insulating film at the time of the rewriting. Consequently, in the status quo, the thinning of the tunnel insulating film is getting closer to its limit.

In order to solve the above-described problem, researches and developments are now being performed concerning non-volatile memories of various types of novel schemes. As one of such novel non-volatile memories, there exists a silicon nano-dots memory where polycrystalline silicon is formed in a dots-like manner instead of a polycrystalline silicon film of the floating gate. This silicon nano-dots memory accumulates electrons in the discrete dots. Accordingly, even if a leakage path is formed within the tunnel oxide film due to the rewriting, only electrons accumulated in a part of the dots pass therethrough. As a result, the silicon nano-dots memory is expected to be highly reliable. Also, it is expected as well to cause multi-bit information to be memorized into a single memory cell by taking advantage of a difference between threshold voltages due to a difference between writing areas. This is performed by selectively writing electrons into a part of dots (S. Tiwari et al.: IEEE International Electron Devices Meeting, pp. 521-524 (1995)).

In the silicon nano-dots memory, however, there occurs a problem of the element-characteristics variation which accompanies nonuniformity of the dots. Consequently, the uniform dot formation is requested. Also, even if rewriting resistance is enhanced, the silicon oxide film is used as the tunnel insulating film. As long as this fact remains unchanged, this enhancement cannot be said to be an essential solution for conquering the limit to the thinning of the tunnel insulating film thickness for maintaining the data retention characteristics.

SUMMARY OF THE INVENTION

It is an object of the present invention to form the nano dots uniformly in the nano-dots memory, and thereby to accomplish the high-reliability implementation. Also, it is another object thereof to employ a silicon-oxide-film alternative material as the tunnel insulating film, and thereby to accomplish the high-speed implementation and high-reliability implementation of the device.

The inventor has reexamined the material components in the nano-dots memory, then focusing an attention on the following facts: High-permittivity insulating material of $HfO_2$, $ZrO_2$ or $CeO_2$ and silicide of $CoSi_2$ or $NiSi_2$ have the same crystalline structure (i.e., $CaF_2$ structure), and only their lattice constants differ by several % (their lattice constants: a=0.512 nm ($HfO_2$), 0.507 nm ($ZrO_2$), 0.541 nm ($CeO_2$), 0.536 nm ($CoSi_2$), 0.540 nm ($NiSi_2$), (R. W. G. Wyckoff: CRYSTAL STRUCTURES Second Edition, Vol. 1, John Wiley & Sons, Inc.)). Based on these facts, the inventor has discovered that employing the above-described high-permittivity insulating material as the tunnel insulating film and the above-described silicide as the memory-used nano dots makes it possible to accomplish the uniform implementation of the nano dots and the high-speed implementation of the device. More concretely, at first, the above-described high-permittivity insulating film is epitaxially grown on a silicon or germanium substrate, thereby forming the tunnel insulating film. At this time, it is preferable that the substrate be a (111) substrate. This condition allows the formation of the high-permittivity insulating film exhibiting excellent crystalline property. Moreover, this condition permits the close-packed plane of the high-permittivity insulating film to appear on the surface. Furthermore, the above-described silicide, which has the same crystalline structure and whose lattice constant differs by several %, is formed on this close-packed plane of the high-permittivity insulating film by using the CVD (: Chemical Vapor Deposition). This allows the uniform silicide to be formed in an island-like manner. Also, as compared with the case where the silicon oxide film is used as the tunnel insulating film, the employment of the high-permittivity tunnel insulating film makes it possible to accomplish the higher-speed implementation of the device and thicker-film implementation of the tunnel insulating film.

According to the present invention, in the nano-dots memory, a high-permittivity insulating film of $HfO_2$, $ZrO_2$ or $CeO_2$ is epitaxially grown on a silicon or germanium substrate, or preferably, on a silicon or germanium (111) substrate. Next, silicide nano-dots of $CoSi_2$ or $NiSi_2$ are formed on this high-permittivity insulating film. This method allows the uniform silicide nano-dots to be formed, thereby making it possible to manufacture the high-reliability device with a small element-characteristics variation. Also, the employment of the high-permittivity insulating film exhibiting excellent crystalline property makes it possible to accomplish the higher-speed implementation of the device.

Other objects, features and advantages of the invention will become apparent from the following description of the embodiments of the invention taken in conjunction with the accompanying drawings.

DETAILED DESCRIPTION OF THE INVENTION

Hereinafter, referring to FIG. 1 to FIG. 23, the detailed explanation will be given below concerning embodiments of the present invention.

EMBODIMENT 1

Figure 1:
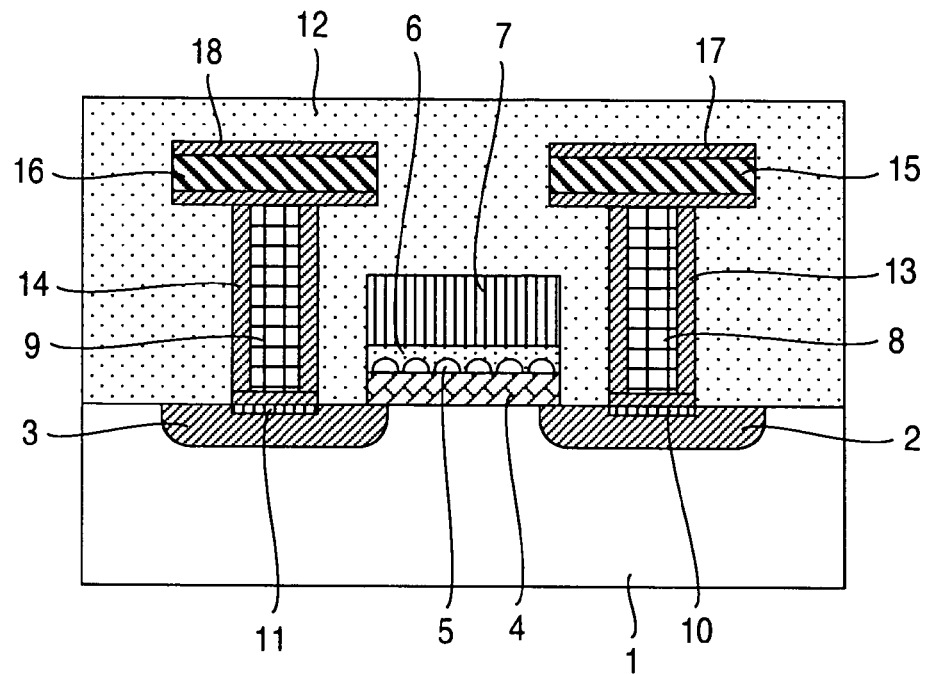
FIG. 1 is a cross-sectional view of a memory cell of a silicide nano-dots memory in a first embodiment.

FIG. 1 is a cross-sectional view of a memory cell of a silicide nano-dots memory in the present embodiment. Source•drain diffusion layers 2 and 3 are formed on a P-type silicon substrate 1. A high-permittivity insulating film 4 composed of $HfO_2$, $ZrO_2$ or $CeO_2$ is formed on the silicon substrate 1 by the epitaxial growth. The silicon substrate may be a germanium substrate. The germanium substrate is superior to the silicon substrate in the high-speed performance of the device, since germanium is larger than silicon in the mobility. Also, it is preferable that the silicon or germanium substrate be a (111) substrate. This condition allows formation of the high-permittivity insulating film exhibiting excellent crystalline property. Silicide 5 of $CoSi_2$ or $NiSi_2$ is formed in a dots-like manner on the high-permittivity insulating film 4. An inter-layer insulating film 6 composed of $SiO_2$ or the like is formed on the silicide nano-dots 5. A control gate 7 is formed on the inter-layer insulating film 6. The control gate 7 is formed of, e.g., a polycrystalline silicon film, a metallic thin film, a metallic silicide film, or a multilayered structure of these films. In particular, considering suppression of the mutual diffusion on the interfacial surface with the inter-layer insulating film, and low-resistance implementation of the gate electrode for the high-speed implementation, the following structure is desirable: Namely, a thin barrier metal of TiN, TaN, or the like exhibiting an excellent adhesive property is used on the inter-layer insulating film, and a metallic thin film of W, Mo, Ta, Ti, or the like is used on the barrier metal. In this case, if the low-resistance property is regarded as being important, W or Mo is used. In the case of W and Mo, W has a high melting point and is superior in thermal stability, while Mo is superior in planar property of the film. Also, if the adhesive property with the barrier metal is regarded as being important, a structure that Ti is used on TiN, or a structure that Ta is used on TaN is used.

Also, contact plugs 8 and 9 composed of W, Al, poly-Si (: polycrystalline silicon), or the like are connected to the source-drain diffusion layers 2 and 3. Here, it is preferable that the contact plugs 8 and 9 be formed after contact layers 10 and 11 are formed on the contact-area interfacial surface, and after barrier metals 13 and 14 are formed on the upper portions of the contact layers and the interfacial surface with an inter-layer insulating film 12. This is preferable in order to implement the adhesive property with the silicon-substrate interfacial surface, and in order to prevent the mutual diffusion and exfoliation on the interfacial surface. Component material of the contact layers 10 and 11 is substance such as cobalt silicide ($CoSi_2$) or titan silicide ($TiSi_2$). Component material of the barrier metals 13 and 14 is substance such as TiN or TaN. The contact plugs 8 and 9 are connected to wiring layers 15 and 16 whose component material is substance such as Al or Cu. It is preferable, however, that the wiring layers 15 and 16 include, at the upper and lower portions, barrier metals 17 and 18 composed of substance such as TiN or TaN. This is preferable in order to prevent the mutual diffusion and exfoliation on the interfacial surface.

Figure 2:
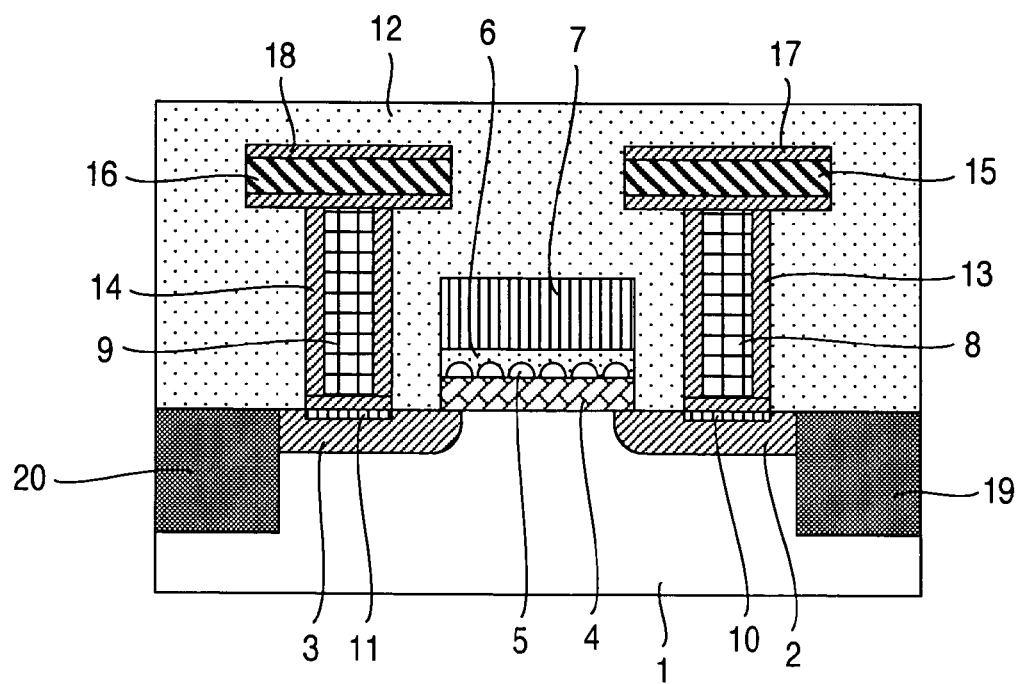
FIG. 2 is a cross-sectional view of the memory cell of the silicide nano-dots memory in the first embodiment.
Figure 3:
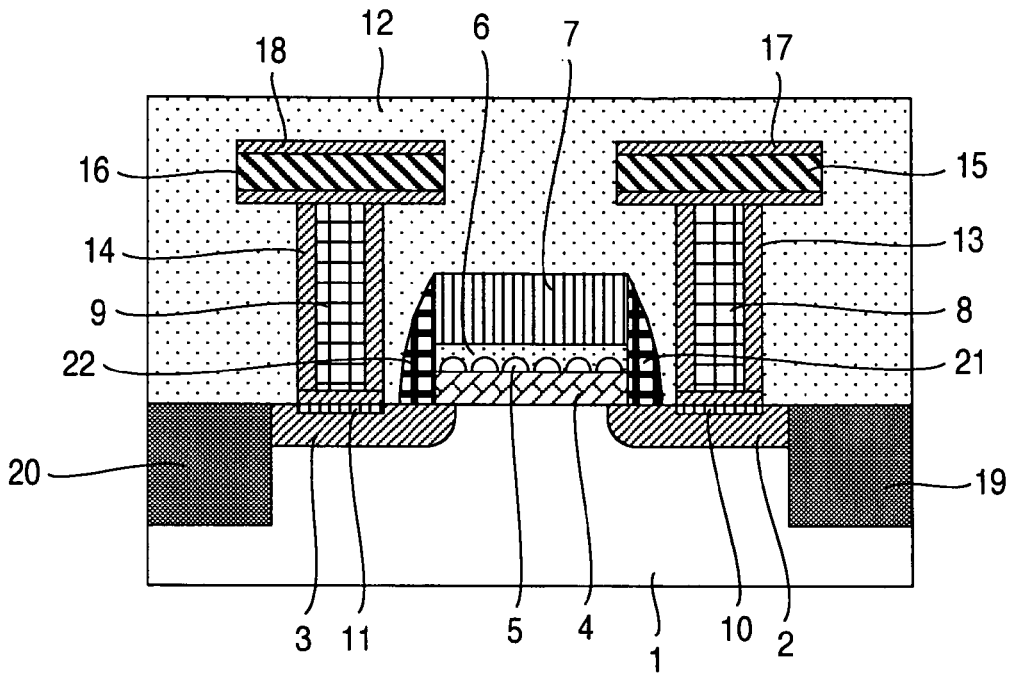
FIG. 3 is a cross-sectional view of the memory cell of the silicide nano-dots memory in the first embodiment.
Figure 4:
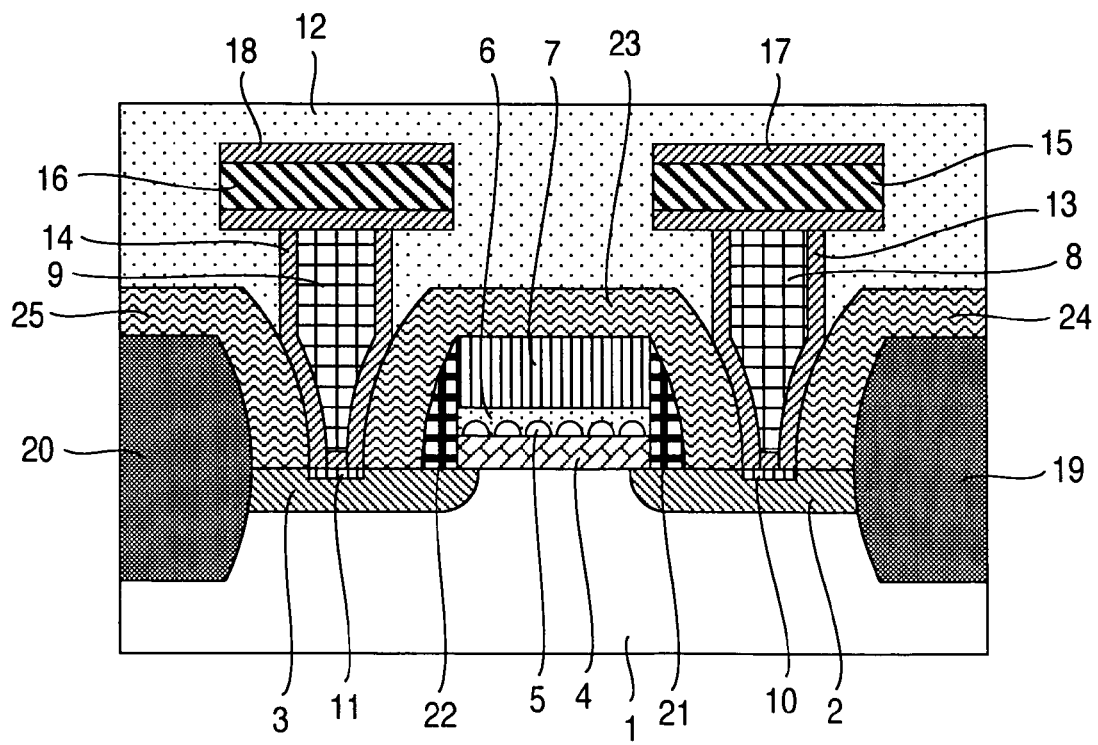
FIG. 4 is a cross-sectional view of the memory cell of the silicide nano-dots memory in the first embodiment.
Figure 5:
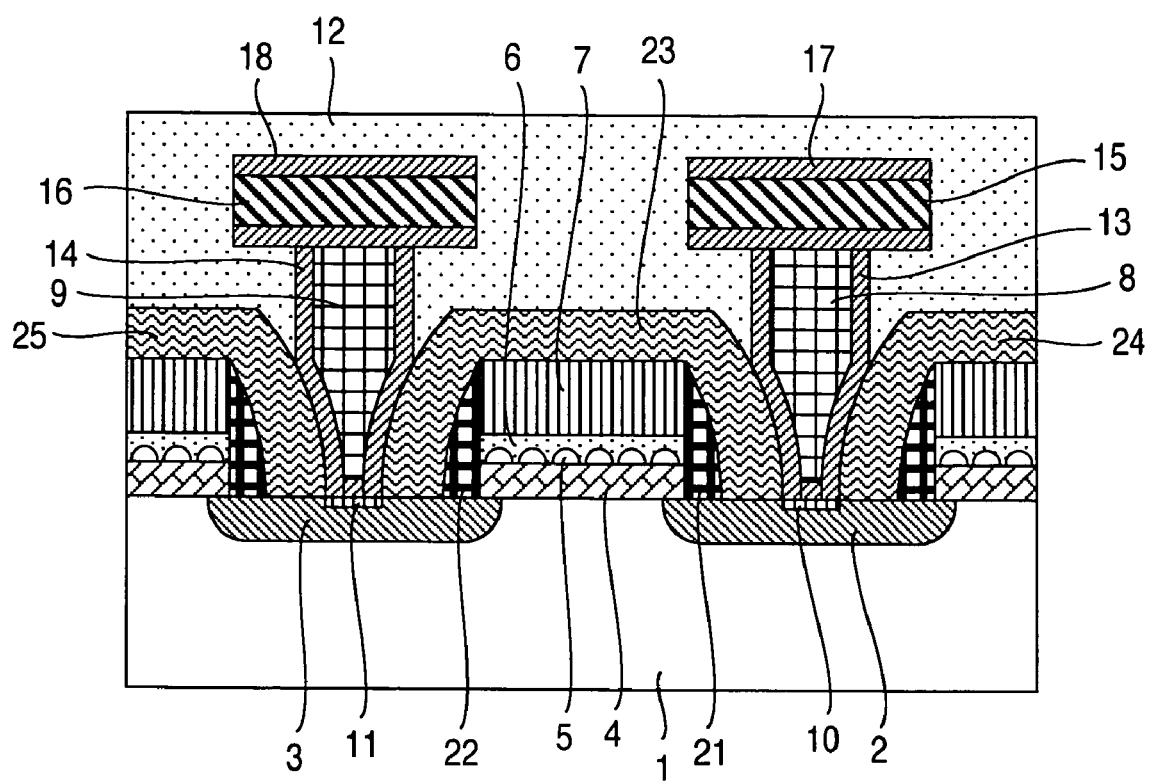
FIG. 5 is a cross-sectional view of the memory cell of the silicide nano-dots memory in the first embodiment.

Also, as illustrated in FIG. 2, the memory cell of the silicide nano-dots memory in the present embodiment may also include element isolation layers 19 and 20 composed of substance such as $SiO_2$ and formed by the STI (: Shallow Trench Isolation), the LOCOS (: Local Oxidation of Silicon), or the like. This case allows implementation of the high integration, since the insulation isolation between the cells is implemented. Otherwise, as illustrated in FIG. 3, the memory cell may also include side walls 21 and 22 composed of substance such as SiN or $SiO_2$. This case allows a reduction in implantation damage of the insulating film at the time of formation of the source•drain diffusion layers 2 and 3. This reduction prevents impurities of the implantation from diffusing in the channel direction, thereby making it possible to suppress and prevent the short-channel effect from occurring. Otherwise, as illustrated in FIG. 4, the contact plugs 8 and 9 may also be formed in a self-aligning manner by using the pattern of an inter-layer insulating film 23 composed of SiN on the transistor and inter-layer insulating films 24 and 25 composed of SiN on the element isolation layers 19 and 20. This case results in an advantage that the positions of contact holes can be accurately maintained even if the mask alignment for lithography has shifted to a certain extent. Otherwise, as illustrated in FIG. 5, the source•drain diffusion layers 2 and 3 may also be made common to adjacent memory cells. This case allows implementation of the high integration, since the cell number per unit area increases. Also, the commonality of the source•drain diffusion layers simplifies the structure, thereby making it possible to reduce the manufacturing cost.

In the silicide nano-dots memory in the present embodiment, the high-permittivity insulating film composed of $HfO_2$, $ZrO_2$ or $CeO_2$ is formed by the epitaxial growth on the silicon or germanium substrate, or preferably, on the silicon or germanium (111) substrate. This condition allows the formation of the high-permittivity tunnel insulating film exhibiting excellent crystalline property. Moreover, this condition permits the close-packed plane of the high-permittivity tunnel insulating film to appear on the surface. Furthermore, the silicide, which has the same crystalline structure and whose lattice constant differs by several %, is formed by the CVD on the high-permittivity tunnel insulating film whose close-packed plane has appeared on the surface. This allows the uniform silicide to be formed in an island-like manner. The successful formation of the uniform nano-dots makes it possible to manufacture the high-reliability and high-yield nano-dots memory with a small element-characteristics variation. Also, the employment of the high-permittivity tunnel insulating film exhibiting excellent crystalline property makes it possible to decrease the equivalent silicon oxide thickness (EOT) even if the film thickness is made thicker than that of the conventional silicon oxide film. Accordingly, it becomes possible to enhance operation speed of the transistor while maintaining excellent data retention characteristics.

Figure 6:
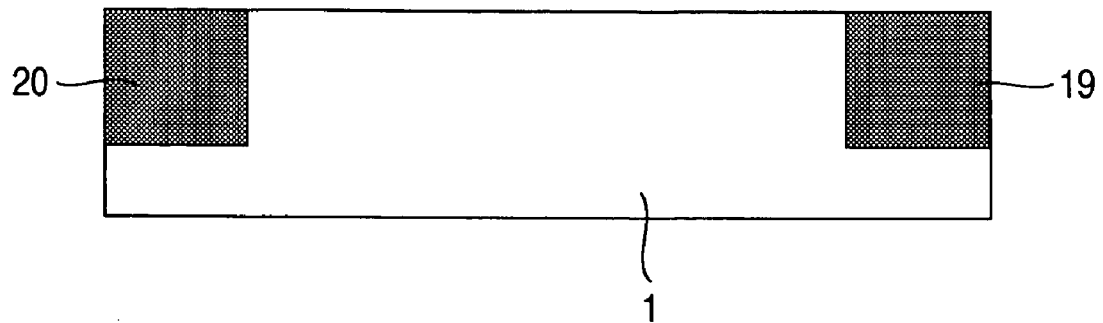
FIG. 6 is an explanatory diagram for a method for manufacturing the memory cell of the silicide nano-dots memory in the first embodiment.
Figure 7:
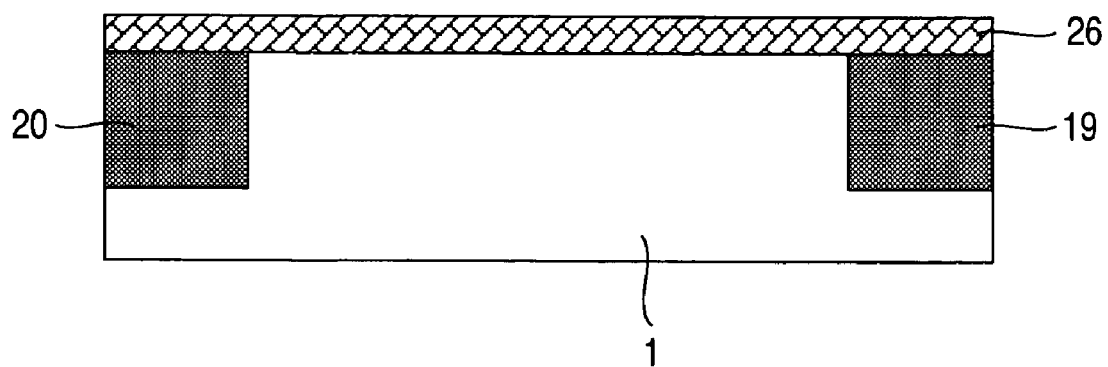
FIG. 7 is an explanatory diagram for the method for manufacturing the memory cell of the silicide nano-dots memory in the first embodiment.
Figure 8:
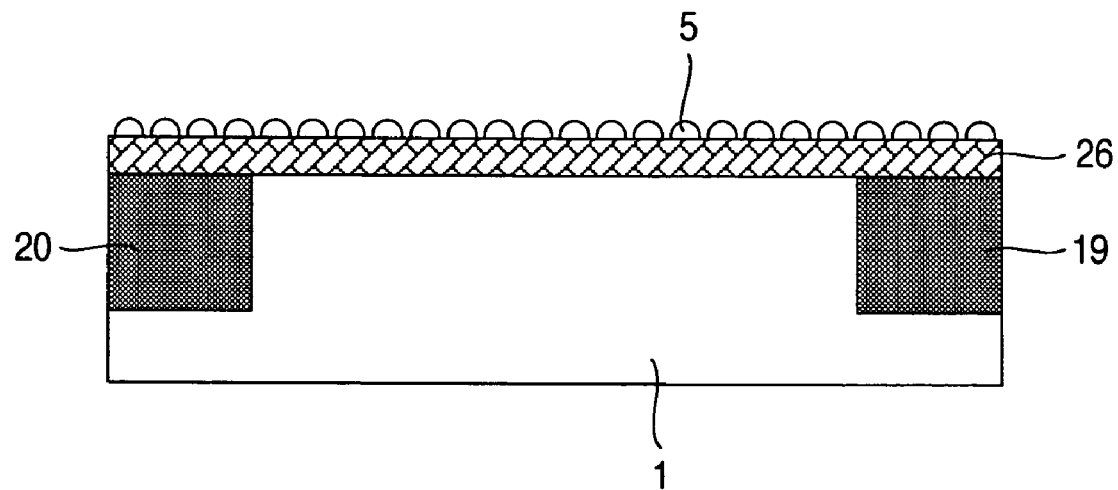
FIG. 8 is an explanatory diagram for the method for manufacturing the memory cell of the silicide nano-dots memory in the first embodiment.
Figure 9:
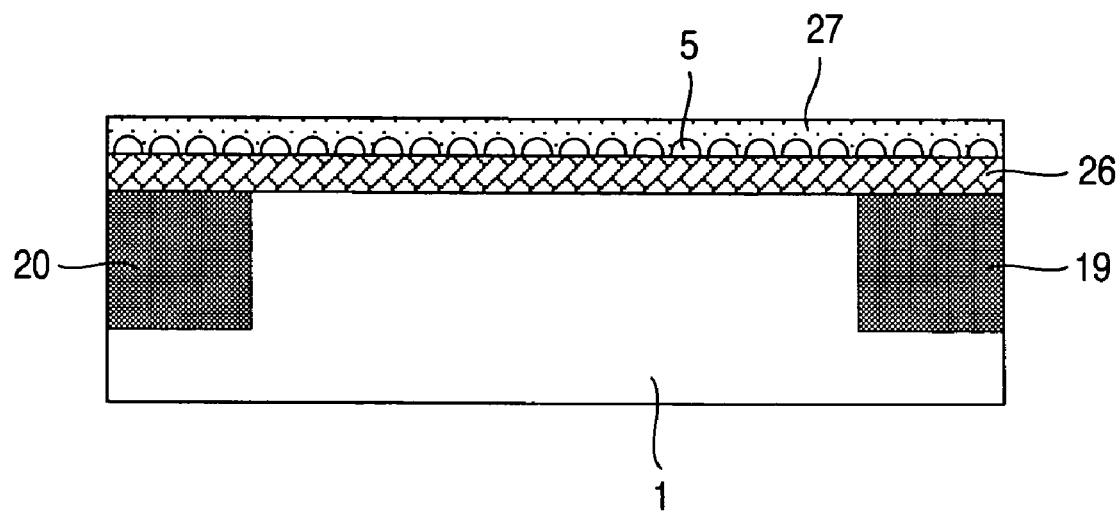
FIG. 9 is an explanatory diagram for the method for manufacturing the memory cell of the silicide nano-dots memory in the first embodiment.
Figure 10:
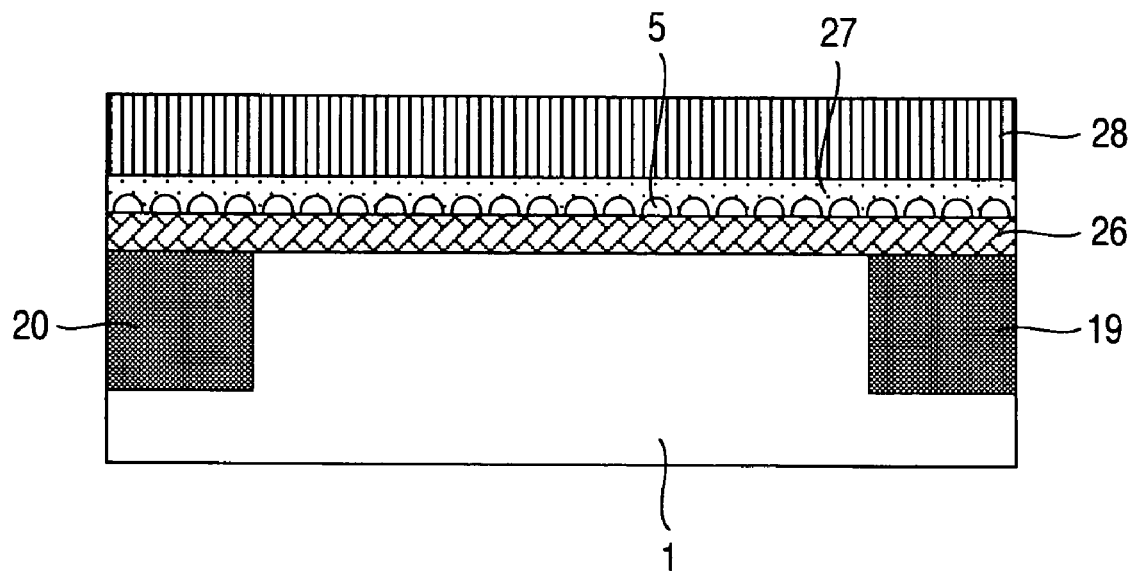
FIG. 10 is an explanatory diagram for the method for manufacturing the memory cell of the silicide nano-dots memory in the first embodiment.

Next, the explanation will be given below concerning a method for manufacturing the memory cell of the silicide nano-dots memory in the present embodiment. Here, the explanation will be given regarding a method for manufacturing the silicide nano-dots of the structure illustrated in FIG. 3. At first, the element isolation layers 19 and 20 are formed by the STI or LOCOS on the P-type silicon or germanium substrate 1 (FIG. 6). Next, the high-permittivity insulating film 26 composed of $HfO_2$, $ZrO_2$ or $CeO_2$ is formed by being epitaxially grown by the CVD or ALD (: Atomic Layer Deposition) (FIG. 7). At this time, it is preferable that the silicon or germanium substrate be a (111) substrate. This condition allows the formation of the high-permittivity insulating film exhibiting excellent crystalline property. Next, the silicide nano-dots 5 of $CoSi_2$ or $NiSi_2$ are formed by the CVD or ALD (FIG. 8). At this time, it is preferable that the diameter of a silicide nano-dot is set at 20 nm or less so that the silicide nano-dots will not be connected to each other. After that, in order to electrically insulate the silicide nano-dots with each other, and to electrically insulate the silicide nano-dots with the electrode at the upper portion of the silicide nano-dots, an inter-layer insulating film 27 composed of $SiO_2$ is deposited by the CVD or ALD (FIG. 9). This tremendously suppresses and prevents electric charges, which are accumulated inside the dots, from moving among the dots, and in the gate or substrate direction. After that, a film 28 to be used as the control gate 7 is formed by the CVD or the like (FIG. 10). Here, the film 28 is a polycrystalline silicon film, a metallic thin film, a metallic silicide film, or a multilayered-structure film of these films containing impurities of P or B.

Figure 11:
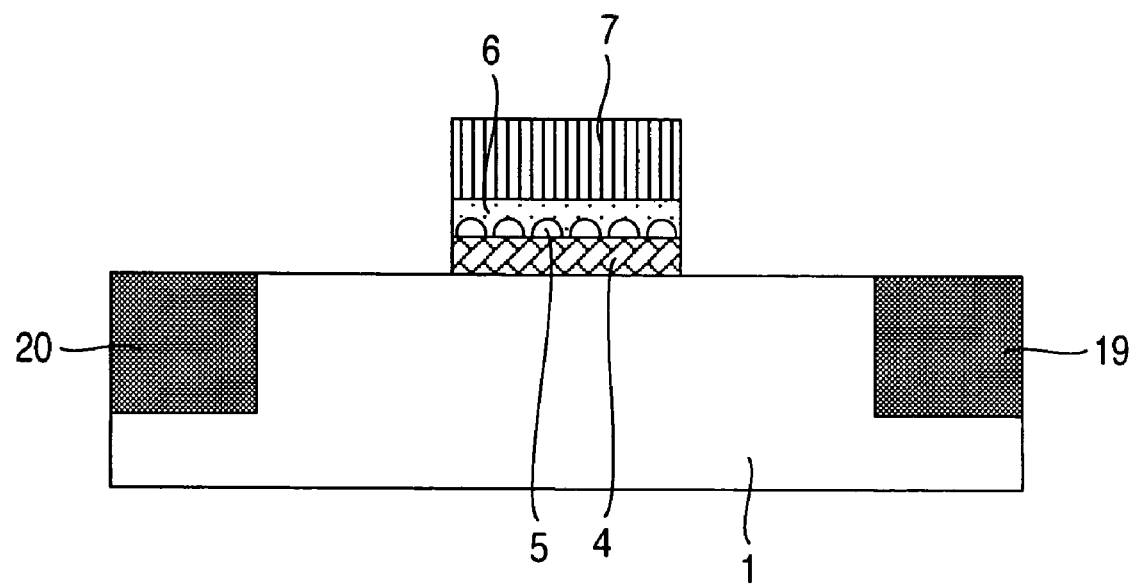
FIG. 11 is an explanatory diagram for the method for manufacturing the memory cell of the silicide nano-dots memory in the first embodiment.
Figure 12:
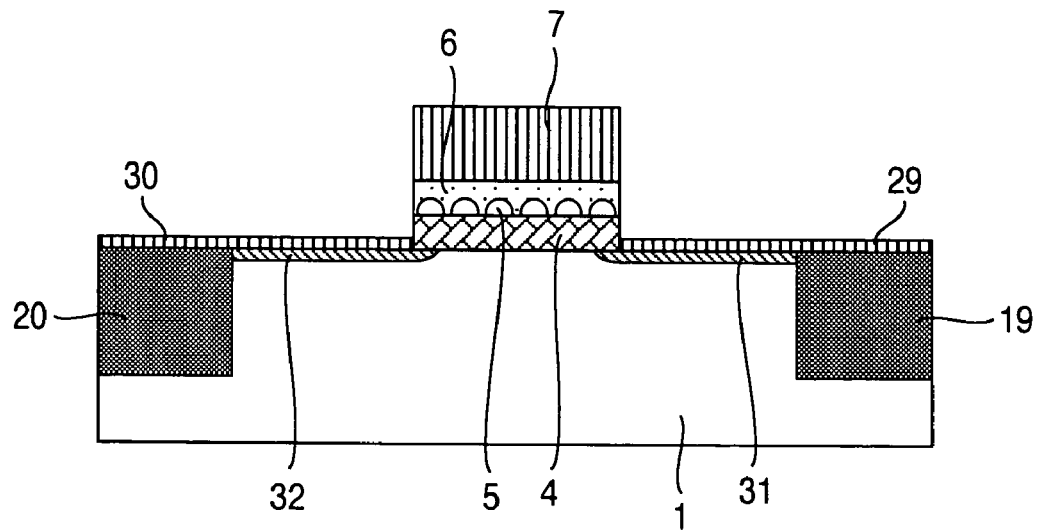
FIG. 12 is an explanatory diagram for the method for manufacturing the memory cell of the silicide nano-dots memory in the first embodiment.
Figure 13:
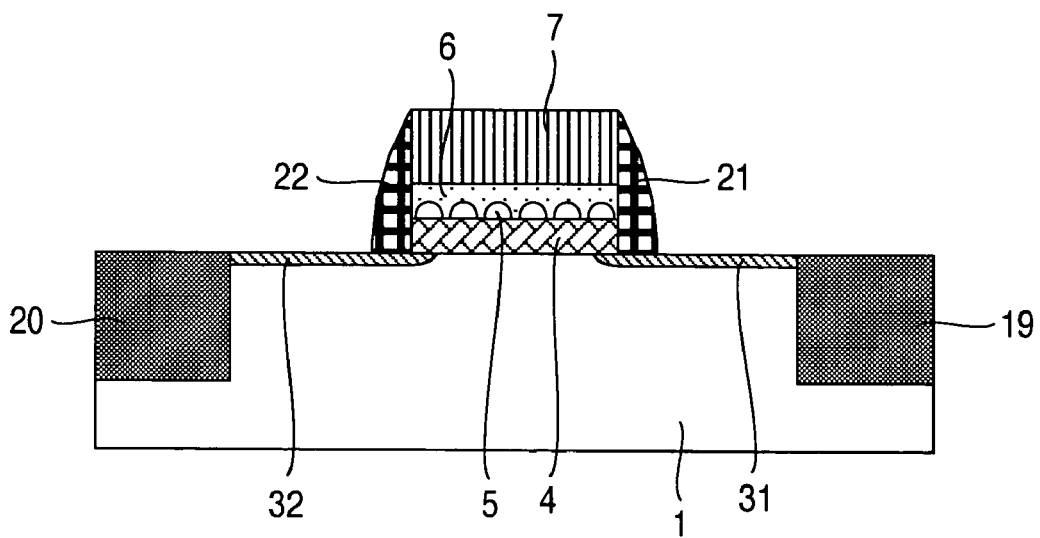
FIG. 13 is an explanatory diagram for the method for manufacturing the memory cell of the silicide nano-dots memory in the first embodiment.
Figure 14:
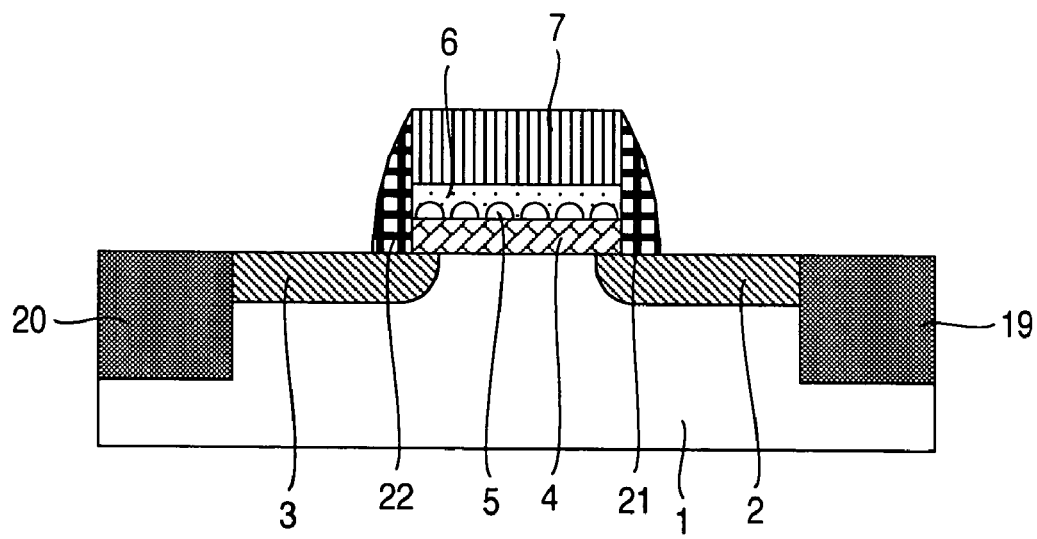
FIG. 14 is an explanatory diagram for the method for manufacturing the memory cell of the silicide nano-dots memory in the first embodiment.

Next, the multilayered-structure film is machined into the memory-cell structure by the etching with a photoresist film used as the mask (FIG. 11). After that, about 2-nm-thick $SiO_2$ or SiN films 29 and 30 are formed by the CVD or thermal oxidation. After that, shallow source•drain areas 31 and 32 are formed by an ion implantation of As or P. This processing step is performed in order to form extension areas for connecting the source•drain diffusion layers with the channel region. The object of formation of the above-described $SiO_2$ or SiN films is a reduction of the damage to the substrate caused by the ion implantation (FIG. 12). Next, an about 200-nm-thick $SiO_2$ or SiN film is deposited by the sputtering or CVD. After that, the etching is performed, thereby forming the side walls 21 and 22 (FIG. 13). After that, the source•drain diffusion layers 2 and 3 are formed by an ion implantation of As or P (FIG. 14).

Figure 15:
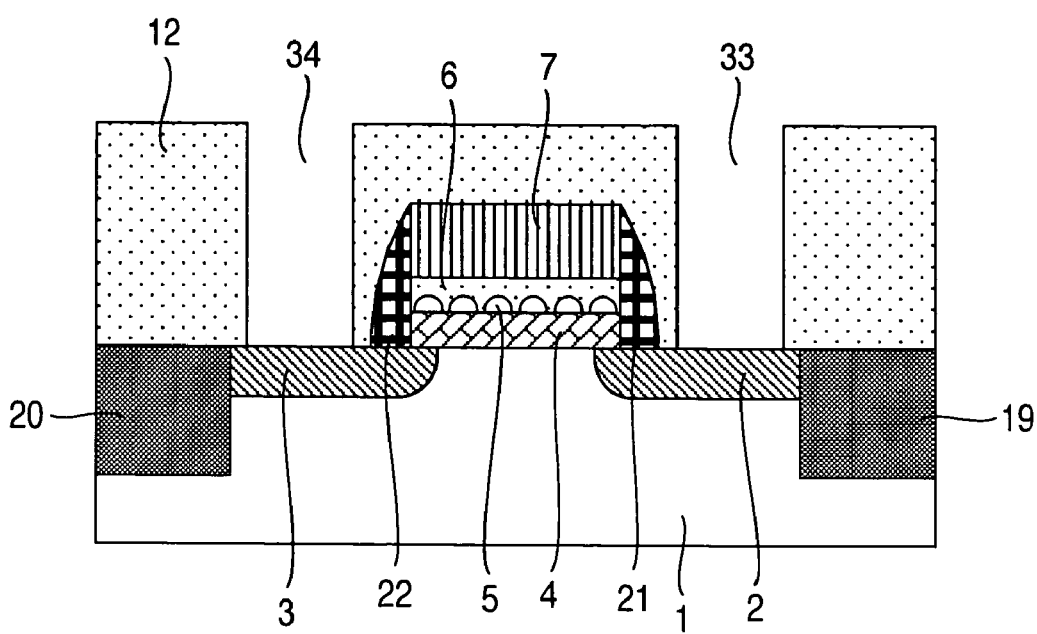
FIG. 15 is an explanatory diagram for the method for manufacturing the memory cell of the silicide nano-dots memory in the first embodiment.
Figure 16:
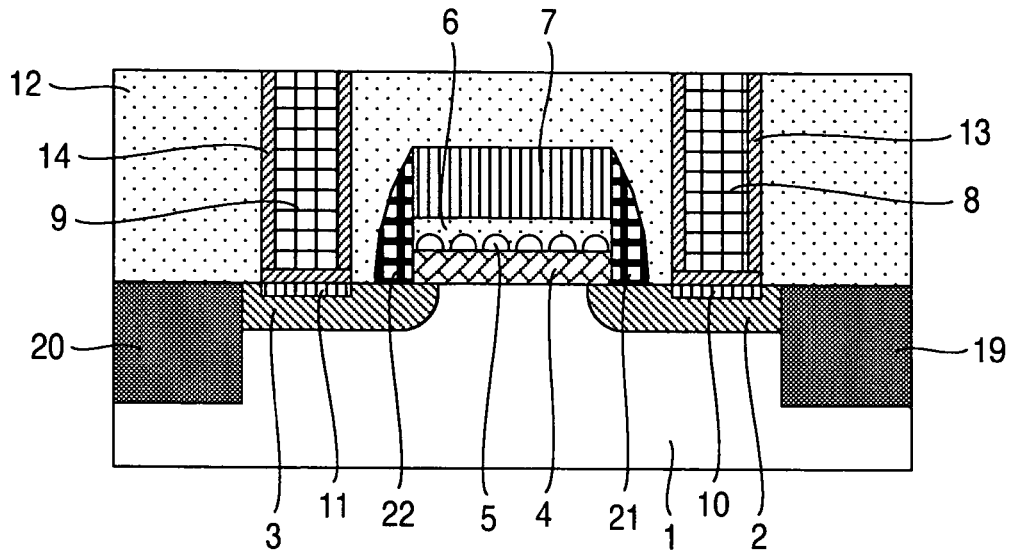
FIG. 16 is an explanatory diagram for the method for manufacturing the memory cell of the silicide nano-dots memory in the first embodiment.
Figure 17:
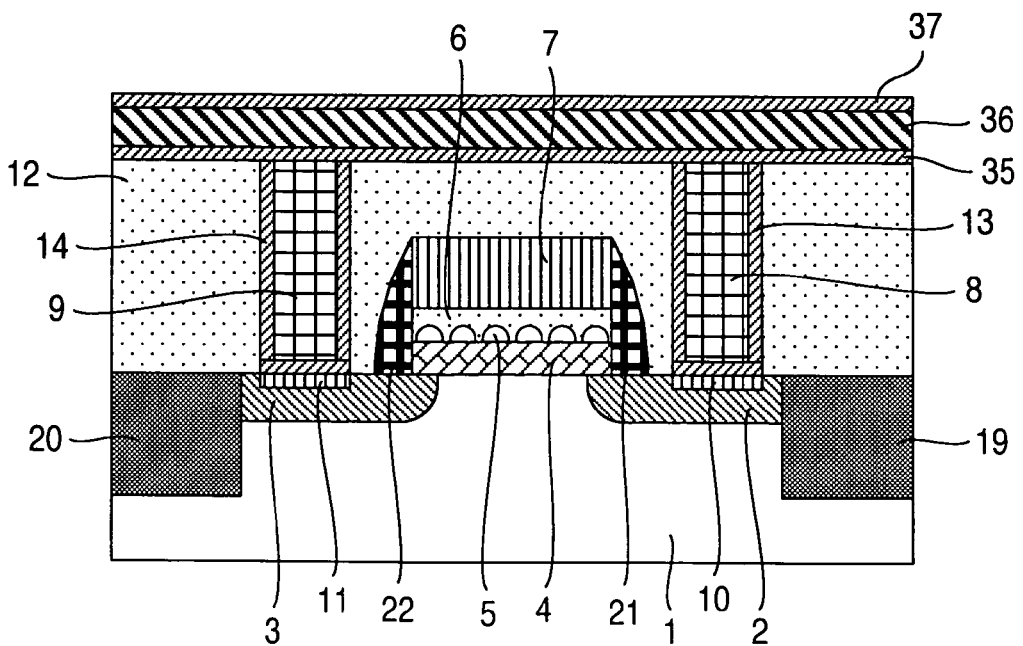
FIG. 17 is an explanatory diagram for the method for manufacturing the memory cell of the silicide nano-dots memory in the first embodiment.
Figure 18:
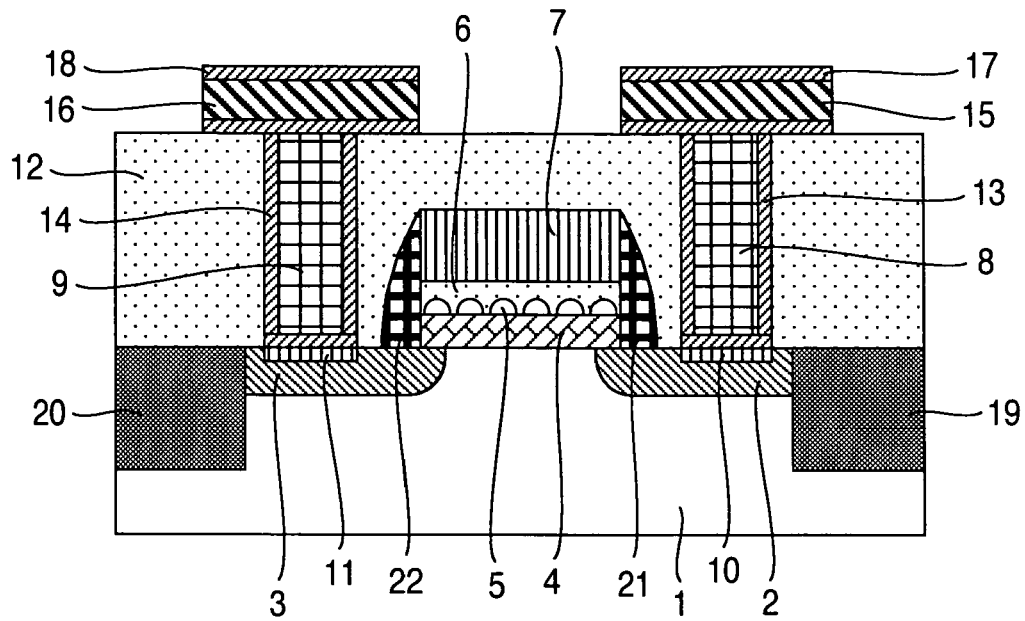
FIG. 18 is an explanatory diagram for the method for manufacturing the memory cell of the silicide nano-dots memory in the first embodiment.

Next, the inter-layer insulating film 12 is deposited by the CVD or sputtering. After that, contact holes 33 and 34 are formed by the etching in such a manner that the contact holes reach the source•drain diffusion layers 2 (FIG. 15). After that, substance such as Co or Ti is deposited on aperture portions of the contact holes by the sputtering or the like, then performing thermal processing. This allows the contact layers 10 and 11 composed of substance such as $CoSi_2$ or $TiSi_2$ to be formed on portions in contact with Si. After that, the substance such as Co or Ti of the portions in contact with the inter-layer insulating film is removed, then forming by the sputtering the barrier metals 13 and 14 composed of substance such as TiN or TaN. After that, the contact plugs 8 and 9 are formed by the sputtering, then performing the planarization by the CMP. Until here, the manufacturing is accomplished as is illustrated in FIG. 16. Next, a barrier metal 35 composed of substance such as TiN or TaN, a wiring layer 36 composed of substance such as Al or Cu, and a barrier metal 37 composed of substance such as TiN or TaN are deposited by the sputtering (FIG. 17), then performing the planarization by the CMP. After that, the machining is performed as is illustrated in FIG. 18 by the etching, thereby forming the wiring layers 15 and 16. After that, an inter-layer insulating film is deposited further. These processes, eventually, form the memory cell of the silicide nano-dots memory illustrated in FIG. 3. Incidentally, in FIG. 3, the wiring layers are illustrated in such a manner that only a single wiring layer is definitely illustrated. It is allowable, however, that a single wiring layer or plural wiring layers further exists or exist on the upper portion, and that the respective wiring layers are connected by a via plug composed of substance such as W, Cu or Al. Also, although, in the above-described manufacturing method, the P-type substrate is used, this method is applicable to the case where the N-type substrate is used.

The above-described manufacturing method makes it possible to manufacture the high-reliability and high-yield nano-dots memory which includes the high-permittivity tunnel insulating film exhibiting excellent crystalline property and the uniform silicide nano-dots.

EMBODIMENT 2

Figure 19:
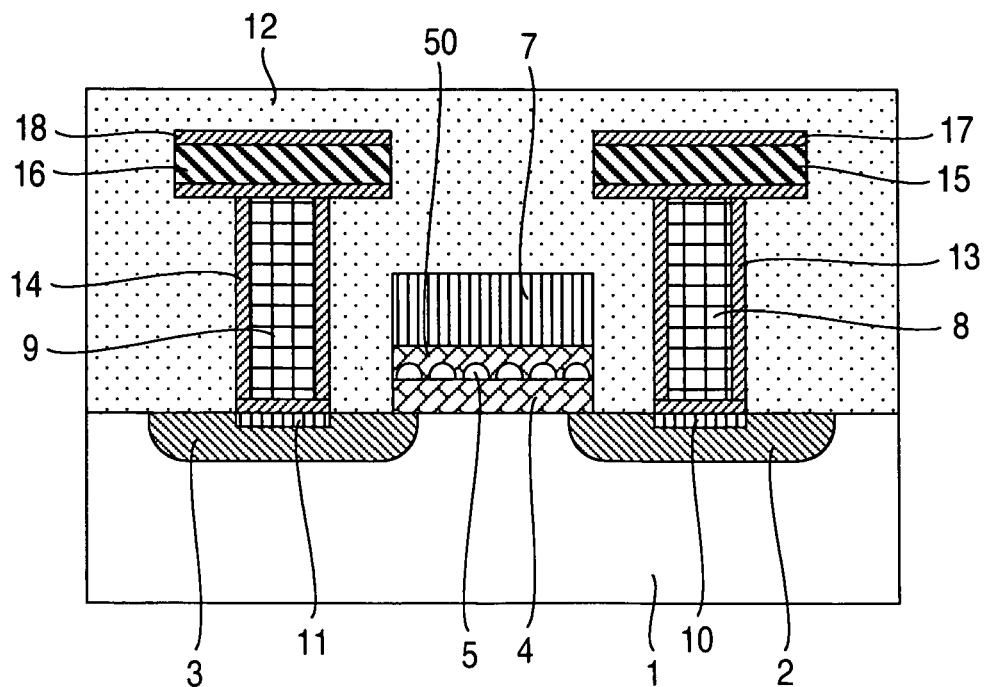
FIG. 19 is a cross-sectional view of a memory cell of a silicide nano-dots memory in a second embodiment.
Figure 20:
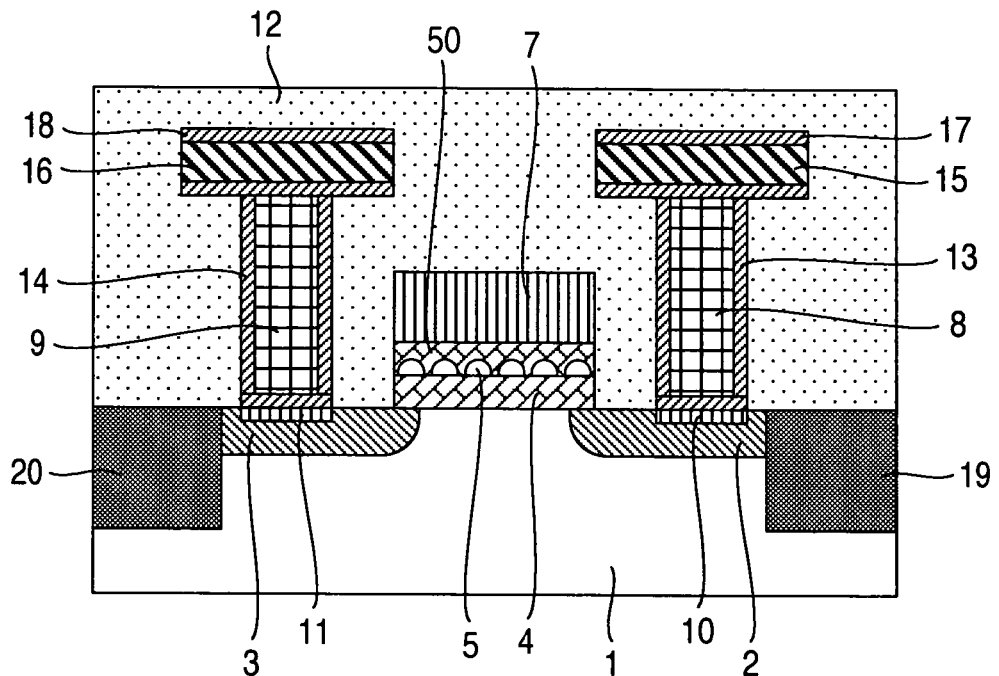
FIG. 20 is a cross-sectional view of the memory cell of the silicide nano-dots memory in the second embodiment.
Figure 21:
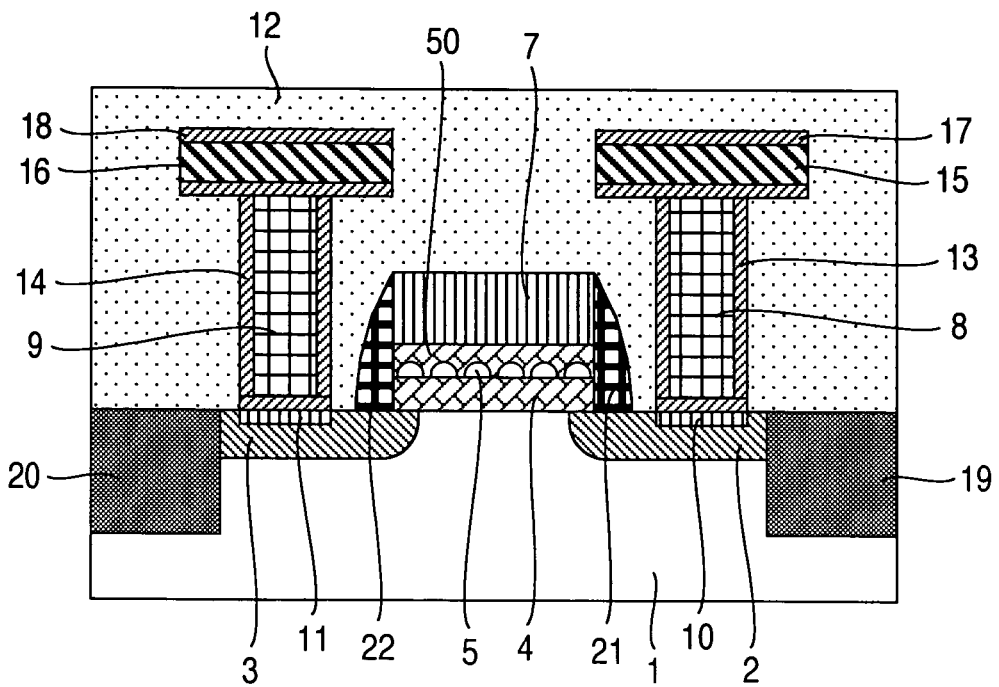
FIG. 21 is a cross-sectional view of the memory cell of the silicide nano-dots memory in the second embodiment.
Figure 22:
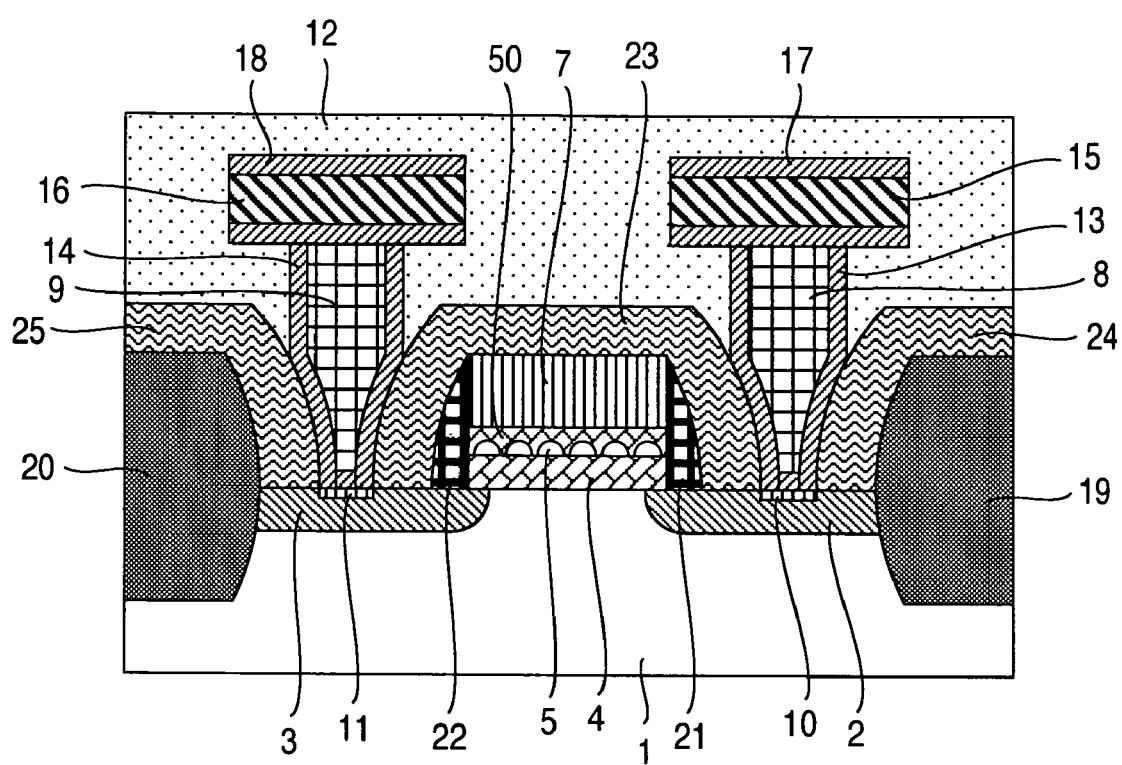
FIG. 22 is a cross-sectional view of the memory cell of the silicide nano-dots memory in the second embodiment.
Figure 23:
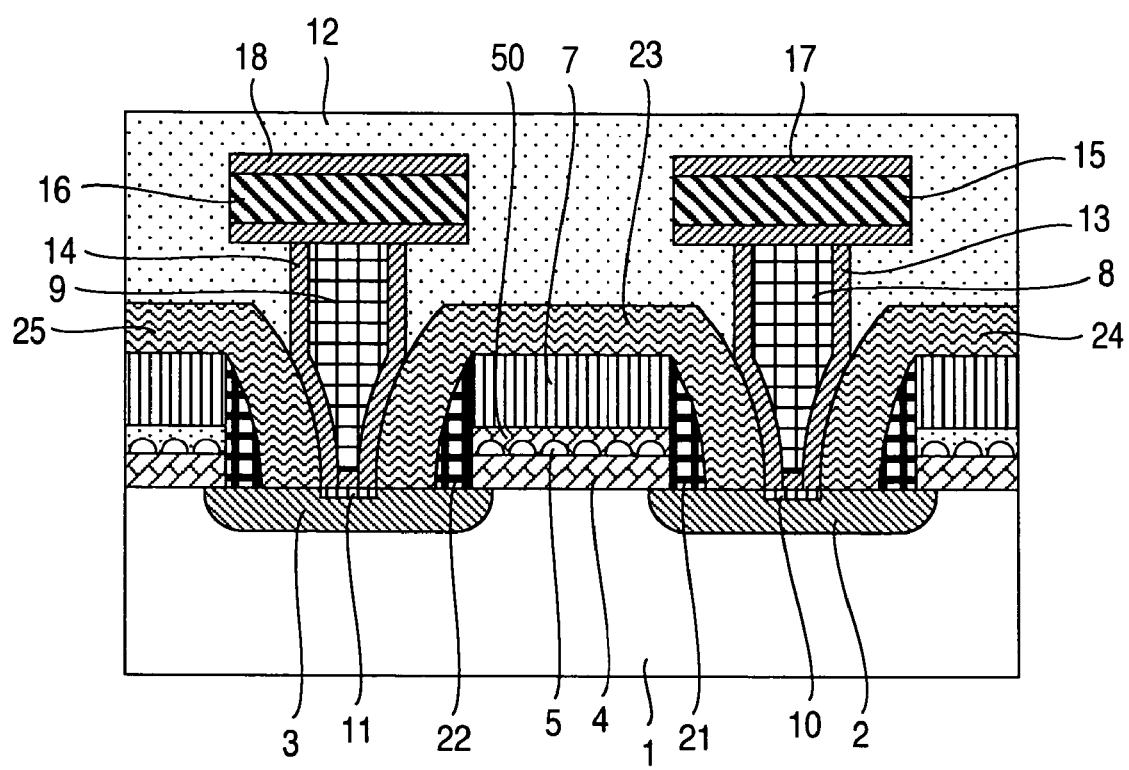
FIG. 23 is a cross-sectional view of the memory cell of the silicide nano-dots memory in the second embodiment.

FIG. 19 is a cross-sectional view of a memory cell of a silicide nano-dots memory in the present embodiment. In the present embodiment, the source•drain diffusion layers 2 and 3 are formed on the P-type silicon or germanium substrate 1. The high-permittivity insulating film 4 composed of $HfO_2$, $ZrO_2$ or $CeO_2$ is formed on the silicon or germanium substrate 1 by the epitaxial growth. Incidentally, it is preferable that the silicon or germanium substrate be a (111) substrate. This condition allows formation of the high-permittivity insulating film exhibiting excellent crystalline property. The silicide 5 of $CoSi_2$ or $NiSi_2$ is formed in a dots-like manner on the high-permittivity insulating film 4. A high-permittivity inter-layer insulating film 50 composed of $HfO_2$, $ZrO_2$ or $CeO_2$ is formed on the silicide nano-dots 5. The control gate 7 is formed on the high-permittivity inter-layer insulating film 50. The present structure is a one where the inter-layer insulating film 6 of the memory cell (FIG. 1) in (the first embodiment) is replaced by the high-permittivity inter-layer insulating film 50. The high-permittivity inter-layer insulating film 50 is formed by the epitaxial growth. Based on this structure, the high-permittivity inter-layer insulating film exhibiting excellent crystalline property is employed on the silicide nano-dots as well. This makes it possible to decrease the equivalent silicon oxide thickness (EOT) even if the film thickness is made thicker than that of the conventional silicon oxide film. Accordingly, it becomes possible to further enhance the operation speed of the transistor while maintaining the excellent data retention characteristics. Also, as illustrated in FIG. 20, the memory cell of the silicide nano-dots memory in the present embodiment may also include the element isolation layers 19 and 20 composed of substance such as $SiO_2$ and formed by the STI, LOCOS, or the like. This case allows implementation of the high integration, since the insulation isolation between the cells is implemented. Otherwise, as illustrated in FIG. 21, the memory cell may also include the side walls 21 and 22 composed of substance such as SiN or $SiO_2$. This case allows a reduction in the implantation damage of the insulating film at the time of formation of the source•drain diffusion layers 2 and 3. This reduction prevents the impurities of the implantation from diffusing in the channel direction, thereby making it possible to suppress and prevent the short-channel effect from occurring. Otherwise, as illustrated in FIG. 22, the contact plugs 8 and 9 may also be formed in a self-aligning manner by using the pattern of the inter-layer insulating film 23 composed of SiN on the transistor and the inter-layer insulating films 24 and 25 composed of SiN on the element isolation layers 19 and 20. This case results in the advantage that the positions of the contact holes can be accurately maintained even if the mask alignment for lithography has shifted to a certain extent. Otherwise, as illustrated in FIG. 23, the source-drain diffusion layers 2 and 3 may also be made common to adjacent memory cells. This case allows implementation of the high integration, since the cell number per unit area increases. Also, the commonality of the source•drain diffusion layers simplifies the structure, thereby making it possible to reduce the manufacturing cost.

The present invention is applicable to the non-volatile memories.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A non-volatile semiconductor memory, comprising:
   a substrate, said substrate being a silicon or germanium substrate,
   a tunnel insulating film on said substrate, said tunnel insulating film being composed of high-permittivity insulating material of $HfO_2$, $ZrO_2$ or $CeO_2$, and
   a charge accumulation unit on said tunnel insulating film, said charge accumulation unit comprising nano-dots, said nano-dots being composed of silicide of $CoSi_2$ or $NiSi_2$.

2. The non-volatile semiconductor memory according to claim 1, wherein said substrate is a (111) substrate of silicon or germanium.

3. A method of manufacturing a non-volatile semiconductor memory, comprising the steps of:
   preparing a silicon or germanium substrate,
   forming a tunnel insulating film on said substrate by epitaxial growth of $HfO_2$, $ZrO_2$ or $CeO_2$, and
   forming nano-dots on said tunnel insulating film by CVD or ALD, said nano-dots being composed of silicide of $CoSi_2$ or $NiSi_2$.

4. The method of manufacturing said non-volatile semiconductor memory according to claim 3, wherein a (111) substrate is prepared as said substrate.

5. The method of manufacturing said non-volatile semiconductor memory according to claim 3, further comprising a step of forming said nano-dots at about 20 nm or less in diameter.

6. The method of manufacturing said non-volatile semiconductor memory according to claim 4, further comprising a step of forming said nano-dots at about 20 nm or less in diameter.

7. A non-volatile semiconductor memory, comprising:
   a substrate, said substrate being a silicon or germanium substrate,
   a tunnel insulating film on said substrate, said tunnel insulating film being composed of high-permittivity insulating material of $HfO_2$, $ZrO_2$ or $CeO_2$,
   a charge accumulation unit on said tunnel insulating film, said charge accumulation unit comprising nano-dots, said nano-dots being composed of silicide of $CoSi_2$ or $NiSi_2$, and
   an inter-layer insulating film on said nano-dots, said inter-layer insulating film existing between said nano-dots and a control gate, said inter-layer insulating film being composed of high-permittivity insulating material of $HfO_2$, $ZrO_2$ or $CeO_2$.

8. The non-volatile semiconductor memory according to claim 7, wherein said substrate is a (111) substrate.

9. A method of manufacturing a non-volatile semiconductor memory, comprising the steps of:
   preparing a silicon or germanium substrate,
   forming a tunnel insulating film on said substrate by epitaxial growth of $HfO_2$, $ZrO_2$ or $CeO_2$,
   forming nano-dots on said tunnel insulating film by CVD or ALD, said nano-dots being composed of silicide of $CoSi_2$ or $NiSi_2$,
   forming an inter-layer insulating film on said nano-dots by epitaxially growing $HfO_2$, $ZrO_2$ or $CeO_2$, and
   forming a control gate on said inter-layer insulating film.

10. The method of manufacturing said non-volatile semiconductor memory according to claim 9, wherein a (111) substrate is prepared as said substrate.

11. The method of manufacturing said non-volatile semiconductor memory according to claim 9, further comprising a step of forming said nano-dots at about 20 nm or less in diameter.

12. The method of manufacturing said non-volatile semiconductor memory according to claim 10, further comprising a step of forming said nano-dots at about 20 nm or less in diameter.

* * * * *